(12) United States Patent
Landolt

(10) Patent No.: US 7,132,890 B2
(45) Date of Patent: Nov. 7, 2006

(54) SYSTEM AND METHOD FOR PROVIDING DISTRIBUTED AMPLIFICATION

(75) Inventor: Oliver D. Landolt, Mountain View, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 92 days.

(21) Appl. No.: 10/636,430

(22) Filed: Aug. 7, 2003

(65) Prior Publication Data

US 2005/0030103 A1    Feb. 10, 2005

(51) Int. Cl.
*H03F 3/60* (2006.01)
(52) U.S. Cl. ...................................... 330/286; 330/295
(58) Field of Classification Search ................. 330/54, 330/124 R, 286, 295
See application file for complete search history.

(56) References Cited

U.S. PATENT DOCUMENTS

| | | | | |
|---|---|---|---|---|
| 4,661,789 A | * | 4/1987 | Rauscher | 330/286 |
| 4,754,244 A | * | 6/1988 | Pavio | 330/286 |
| 5,227,734 A | * | 7/1993 | Schindler et al. | 330/286 |
| 5,510,758 A | * | 4/1996 | Fujita et al. | 333/247 |
| 5,650,748 A | * | 7/1997 | Johnston et al. | 330/294 |
| 5,821,827 A | * | 10/1998 | Mohwinkel et al. | 331/117 D |
| 6,396,349 B1 | * | 5/2002 | Takei et al. | 330/286 |
| 6,518,844 B1 | * | 2/2003 | Sherman et al. | 330/286 |
| 6,653,905 B1 | * | 11/2003 | Ishibayashi | 330/295 |
| 6,768,380 B1 | * | 7/2004 | Hong et al. | 330/286 |
| 6,778,031 B1 | * | 8/2004 | Baba et al. | 331/107 DP |

OTHER PUBLICATIONS

"Differential 4-tap and 7-tap Transverse Filters in SiGe for 10Gb/s Multimode Fiber Optic Link Equalization," Digest of Technical Papers—2003 IEEE International Solid-State Circuits Conference (Feb. 11, 2003), pp. 180-181.
"A 0-dB IL 2140+30 MHz Bandpass Filter Utilizing Q-Enhanced Spiral Inductors in Standard CMOS," 2002 IEEE Journal of Solid-State Circuits (May 2002), vol. 37, No. 5, pp. 579-586.
"Multi-GigaHertz Low-Power Low-Skew Rotary Clock Scheme," Digest of Technical Papers—2001 IEEE International Solid-State Circuits Conference (Feb. 7, 2001), pp. 400-401, 470.
"Electromagnetic investigation on the propagation in distributed active devices," Microw. Antennas Propag. IEE Proceedings (Oct. 1997), vol. 144, No. 5, pp. 281-288.
"Theory of Traveling-Wave Transistors," Transactions on Electron Devices—1982 IEEE (Dec. 1982), vol. Ed-29, No. 12, pp. 1845-1853.
"Traveling-Wave Tube Amplifiers," Application Note 14—Hewlett-Packard Company, Copyright 1955, pp. 1-11.
David M. Pozar, "Microwave Engineering", John Wiley & Sons, Inc., Copyright 1998, Second Edition, pp. 635-641.

* cited by examiner

*Primary Examiner*—Khanh Van Nguyen

(57) ABSTRACT

A distributed amplifier, or if desired, an oscillator can be constructed using an active transmission line. The active transmission line, in turn, can be constructed using an auxiliary conductor inductively coupled to the primary conductor. The auxiliary conductor is driven by the primary conductor through an active shunt network distributed along the transmission line. The auxiliary conductor is placed close enough to the primary conductor so that the two conductors have a substantial amount of mutual inductance as compared to their self-inductance. In a variation of this system, the transmission line can be operated in differential mode. In one embodiment, a combination of conductance and transconductance are used to achieve gain in the transmission line for high frequency signal transmission. With absorbing terminations, the active transmission line constitutes an amplifier. With reflective terminations, the active transmission line constitutes an oscillator.

19 Claims, 10 Drawing Sheets

SYSTEM AND METHOD FOR PROVIDING DISTRIBUTED AMPLIFICATION

CROSS-REFERENCE TO RELATED APPLICATIONS

The present application is related to concurrently filed, co-pending, and commonly assigned U.S. patent application Ser. No. 10/636,098, entitled "SYSTEM AND METHOD FOR PROVIDING A LOSSLESS AND DISPERSION-FREE TRANSMISSION LINE"; and U.S. patent application Ser. No. 10/636,094, entitled "SYSTEM AND METHOD FOR PROVIDING A DELAY LINE AND/OR FINITE IMPULSE RESPONSE FILTERS USING A LOSSLESS AND DISPERSION-FREE TRANSMISSION LINE", the disclosures of which are hereby incorporated herein by reference.

TECHNICAL FIELD

This invention relates to distributed amplifiers and more specifically to systems and methods for providing amplification using active feedback along a transmission line.

BACKGROUND OF THE INVENTION

The bandwidth of ordinary amplifiers is typically limited by parasitic capacitances. As frequency increases, the impedance of such capacitances decreases, thereby tending to short-circuit the signal to ground or to other circuit nodes. A common approach to extend the bandwidth of amplifier circuits consists of adding inductors at judicious locations. When properly designed, the combination of such inductors and the surrounding parasitic capacitances results in an equivalent impedance retaining a substantial magnitude over a wider frequency range than the parasitic capacitances alone, thereby extending the amplifier bandwidth. Transmission lines constitute a particular example of this technique. Such lines have distributed capacitance to ground tending to short-circuit the signal, but the existence of distributed inductance along the line results in an overall impedance which is resistive at any frequency (at least in a somewhat idealized theoretical case).

Some amplifier circuits (known as "distributed amplifiers") take advantage of this fact. Typically, they consist of multiple ordinary amplifier circuits connected in parallel through inductors (see e.g. D. M. Pozar, *Microwave engineering*, 2$^{nd}$ ed, John Wiley & Sons, 1998). The parasitic capacitances associated with the inputs and outputs of the ordinary amplifier circuits combine with the inductors to form transmission lines. Therefore, these parasitic capacitances do not contribute to restrict the bandwidth of the ordinary amplifier circuits. They are said to be "absorbed" by the transmission lines. As a result, distributed amplifiers typically achieve a much larger bandwidth than individual ordinary amplifier circuits used in isolation. However, this type of distributed amplifier suffers from some shortcomings. One of the problems is that the transmission lines connecting the ordinary amplifier circuits together unavoidably have losses due to the series resistance of the inductors. Such losses cause the input signal to wane as it travels along the transmission line connecting the inputs of the ordinary amplifier circuits, thereby limiting the number of amplifiers which can be put in parallel. A second shortcoming is that the overall gain of the distributed amplifier grows only linearly with the number of elementary amplifiers used in the structure. It would take a large number of elementary amplifiers to achieve a large gain.

BRIEF SUMMARY OF THE INVENTION

The limitations of existing distributed amplifiers can be overcome by using a transmission line including distributed active feedback elements causing the signal to grow as it travels along the line. One system for achieving gain in a primary conductor is by use of an auxiliary conductor inductively coupled to the primary conductor. The auxiliary conductor is driven by the primary conductor through an active shunt network distributed along the transmission line. In a variation of this system, two pairs of conductors including a first and second primary conductor and a first and second auxiliary conductor can be operated in differential mode. As will be seen later, the distributed active shunt network can be particularly simple in differential mode.

A distributed amplifier can be constructed using an auxiliary conductor inductively coupled to the primary conductor. The auxiliary conductor is driven by the primary conductor through an active shunt network distributed along the transmission line. The auxiliary conductor is placed close enough to the primary conductor so that the two conductors are inductively coupled (i.e. have a substantial amount of mutual inductance compared to their self-inductance). In a variation of this system, two pairs of conductors including a first and second primary conductor and a first and second auxiliary conductor can be operated in differential mode.

In one embodiment, a combination of conductance and transconductance are used to cancel losses and control dispersion in the transmission line for high frequency signal transmission. The signal is not assumed to be binary in amplitude, and the transmission line can operate on analog as well as digital signals. In such an embodiment, transconductance is achieved in a differential transmission line by inducing a signal from each transmission line into closely coupled parallel lines, adding active elements between each of the coupled lines to a common ground plane and influencing the current through each active element by the signal on the opposite transmission line.

In another embodiment the transmission line provides gain while remaining dispersion-free. The total gain grows exponentially with line length and there is no fundamental limit to the length over which the transmission line will provide gain.

In another embodiment the bi-directional nature of the transmission line enables the implementation of active resonant line segments for use as on-chip frequency references. Thus, an oscillator can be constructed without the use of crystals or other control devices.

In still another embodiment, the transmission line can be used as a delay line, for example, in a finite impulse response (FIR) filter.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated that the conception and specific embodiment disclosed may be readily utilized as a basis for modifying or designing other structures for carrying out the same purposes of the present invention. It should also be realized that such equivalent constructions do not depart from the invention as set forth in the appended claims. The novel features which are believed to be characteristic of the invention, both as to its organization and method of operation, together with advantages will be better understood from the following description when considered in connection with the accompanying figures. It is to be expressly understood, however, that each of the figures is provided for the purpose of illustration and description only and is not intended as a definition of the limits of the present invention.

DETAILED DESCRIPTION

Before beginning the description, it should be noted that envisioned applications include transmission of critical high-frequency a.c. signals within large chips, or over long distance transmission lines with the concepts taught herein being used in repeaters to boost and control signal dispersion. In addition, accurate delay lines, on-chip oscillators and frequency references, high-speed output drivers and distributed electrostatic discharge (ESD) protection structures, finite impulse response filter and other circuit elements could also be designed around the concepts discussed herein. Amplifier array chips based on these concepts could be inserted in series with long printed-circuit board (PCB) traces in order to split their length and thereby boost the bandwidth of such traces.

Figure 1:
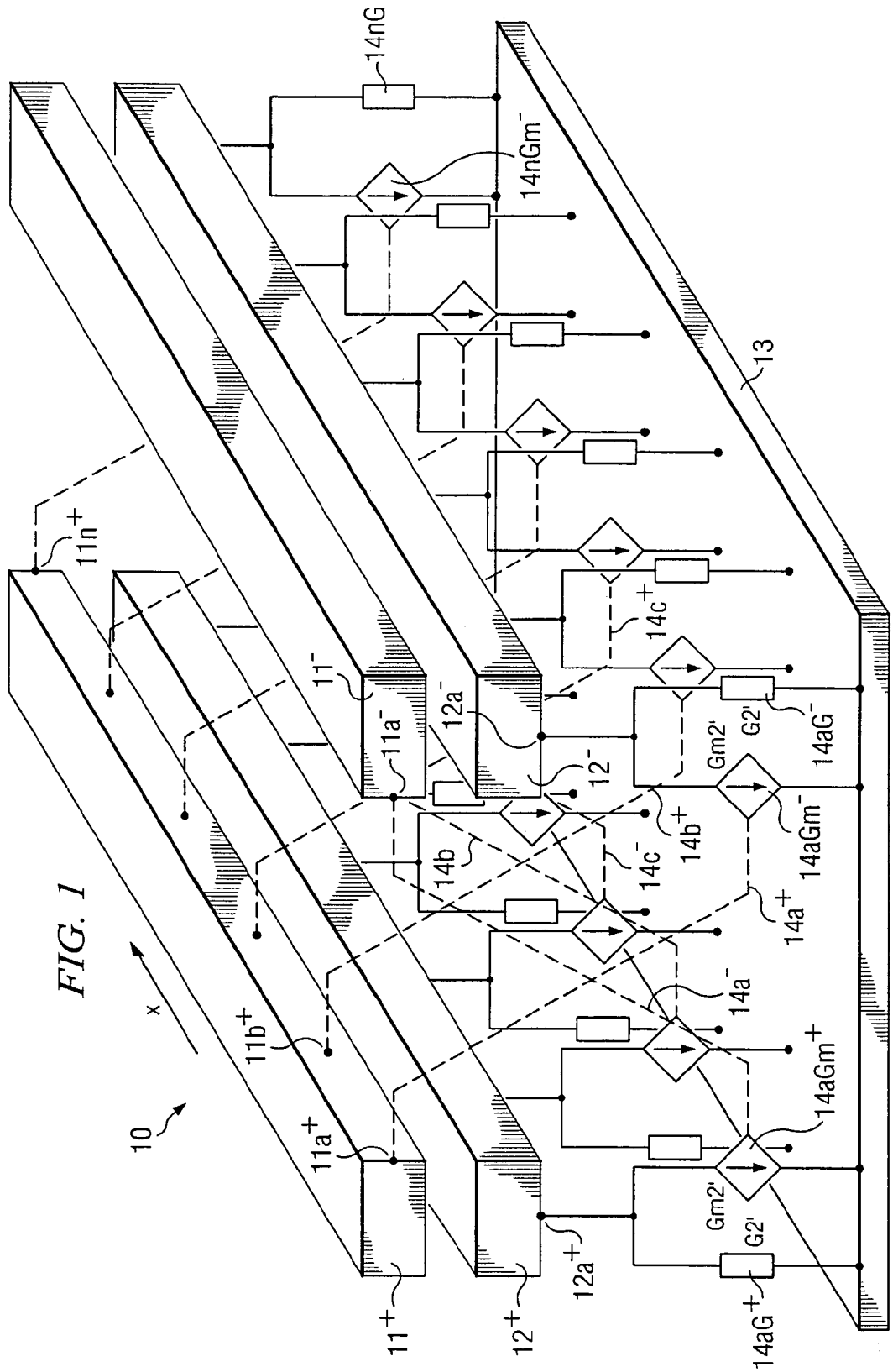
FIG. 1 shows a schematic representation of one embodiment.

FIG. 1 shows a schematic representation of one embodiment, in which a symmetrical distributed structure is represented. The distributed structure shown in FIG. 1 includes differential transmission lines such that transmission line $11^+$ carries the exact opposite signal from transmission line $11^-$. Coupled to, but not electrically connected with, each transmission line is an auxiliary conductor, such as conductor $12^+$ and conductor $12^-$. Conductor 13 is the common return path ground. The cross-section structure is essentially invariant along the direction of the x axis. Each conductor $12^+$ and $12^-$ is connected to common ground 13 by a number of conductance and transconductance elements spaced along the transmission line corresponding to points $11a^+$ to $11n^+$ on conductor $11^+$ and points $11a^-$ to $11n^-$ on conductor $11^-$. In the embodiment shown, transconductance is achieved by controlling a current device, such as current device $14aGm^+$ from the differential "opposite" transmission line. Thus, the transconductance elements associated with transmission line $11^+$ are controlled by the signals at the respective point on opposite transmission line $11^-$. In FIG. 1, x is the direction of a.c. transmission and, as will be discussed, can be bi-directional.

Figure 2:
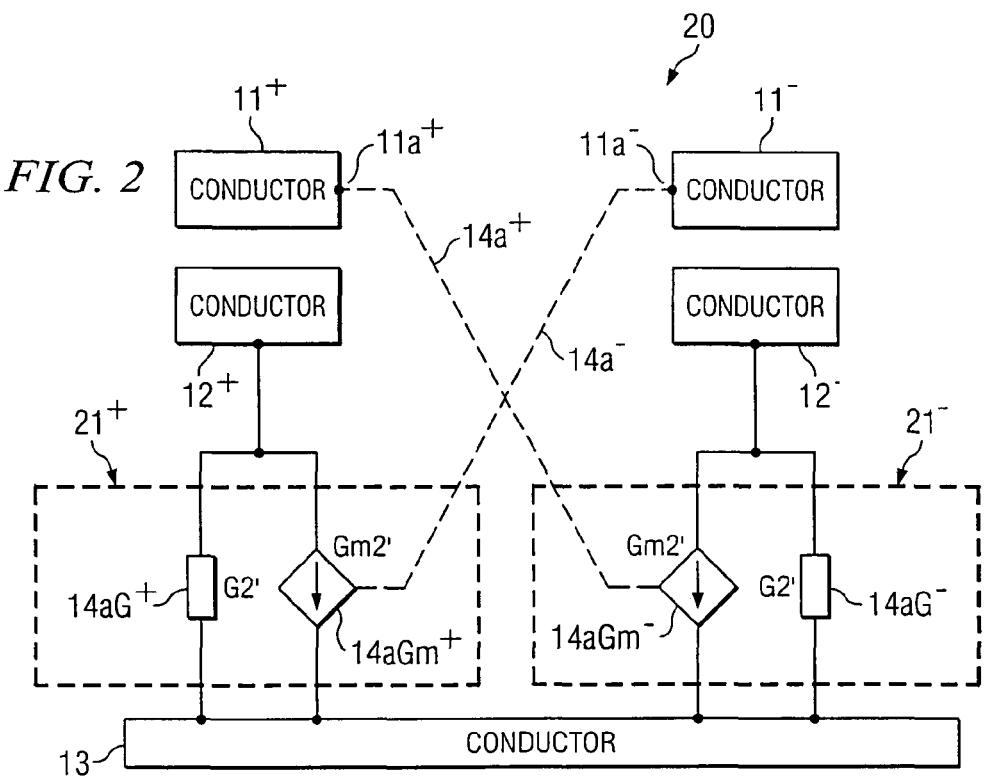
FIG. 2 shows a single slice of the structure of FIG. 1.

For better clarity, FIG. 2 shows a schematic of a single slice 20 of the structure shown in FIG. 1. Conductors 11 and 12 (for convenience, the notation conductor 11 means both conductors $11^+$ and $11^-$ and similarly, conductor 12 means conductors $12^+$ and $12^-$) are close enough to each other such that the capacitance between them is not much smaller than is the capacitance between conductors 11 and 13 or between conductors 12 and 13. The spacing between the positive and the negative side of the differential transmission pair is not critical. Optimally, the positive and negative conductors should be far apart enough so that the capacitance between them is smaller than the capacitance between them and conductor 13. A factor of 3 smaller would be ample. For example, the spacing of the conductors should be such that the capacitance between conductors $11^+$ and $11^-$ is less than 60 pF/m while, as shown in Table 2, the capacitance (C10') between conductors 11 and 13 (ground) is, for example, 173 pF/m. The capacitance between conductors $12^+$ and $12^-$ is less than 7 pF/m, while the capacitance (C20') between conductors 12 and 13 is, for example, 21.2 pF/m. These examples assume the other capacitances have the values shown in Table 2, discussed hereinafter. The other parameters are as shown in Table 2.

Ideally, active shunt network 21 would be truly distributed along the length of the transmission line. In this case, conductance $14aG^+$ would be a made of continuous resistive material, whereas $14aGm^+$ would be a single, very wide transistor. However, in common integrated circuit technologies, it would be difficult to cross-connect the control electrodes between the two sides of the differential structure in a truly distributed implementation. This is so because lines $14a^+$ and $14a^-$ (as well as lines $14b^+$ and $14b^-$; $14c^+$ and $14c^-$, etc.) each would be continuous and thus physically unable to cross. Instead, a good approximation of the distributed shunt network can be obtained by lumped shunt circuits placed at regular intervals along the transmission lines, as shown in FIG. 1.

Each pair of coupled transmission lines is characterized by a set of capacitances and inductances per unit length, as well as the series resistance per unit length of each conductor. These parameters are listed and described in Table 1. As will be discussed, wave propagation in conductors $11^+$ and $11^-$ is lossless and dispersion-free in differential mode if the shunt element values are chosen as follows (the prime mark is used to indicate per unit length):

$$G2' = \frac{R1' \cdot C12'}{M12'} \quad (1)$$

$$Gm2' = R1' \frac{C10' + C12'}{M12'} \quad (2)$$

TABLE 1

Transmission line parameters

| Parameter | Description |
|---|---|
| C10' | capacitance per unit length between conductors 11 and 13 |
| C20' | capacitance per unit length between conductors 12 and 13 |
| C12' | capacitance per unit length between conductors 11 and 12 |
| L1' | self-inductance per unit length of conductor 11 |
| L2' | self-inductance per unit length of conductor 12 |
| M12' | mutual inductance per unit length between conductors 11 and 12 |
| R1' | series resistance per unit length of conductor 11 |
| R2' | series resistance per unit length of conductor 12 |

Lossless and dispersion-free propagation is available over the whole frequency range where the above conditions can be satisfied. It should be noted that a constant resistance per unit length R1' is a reasonable approximation in integrated circuits, where conductors are typically thin compared to skin depth, even at frequencies of several gigahertz.

A single-ended (non-differential) lossless transmission line could be implemented using a negative distributed transconductance Gm2'. Unfortunately, such an element is not available, so the differential structure with cross-coupled control electrodes 14⁺ and 14⁻ effectively emulates a transconductance Gm2' for the differential component of the wave in conductors 11⁺ and 11⁻. Any common-mode component will be affected by losses and decay as the wave travels along the transmission line.

Figure 3A:
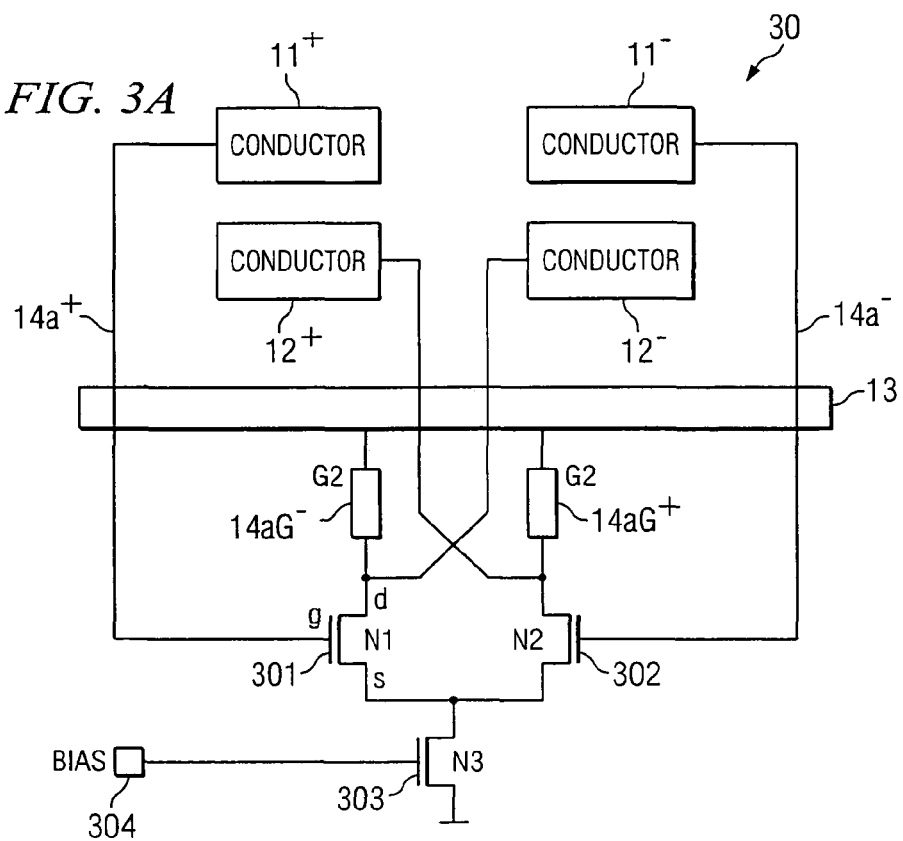
FIGS. 3A, 3B, 3C and 3D depict embodiments of lumped implementations of differential and non-differential circuits.

FIG. 3A depicts one embodiment 30 of a lumped active shunt network. An instance of this circuit or its equivalent is placed at regular intervals Δx along the transmission line. In FIG. 1, these intervals would be at locations 11a, 11b, 11c to 11n and would be the same on both differential lines (+ and −). Lumped conductance G2 (14aG⁺) has a value G2'·Δx. Similarly, transistors N1 (301) and N2 (302) should have a transconductance Gm2 equal to Gm2'·Δx. This transconductance can be adjusted, for example, by using input terminal bias (304) and transistor N3 (303). Instead of using MOSFETs, as shown, this circuit could as well be implemented using other types of transistors or even other circuit elements.

In FIG. 3A, conductors 11⁺ and 11⁻ are shown on top of conductors 12⁺ and 12⁻ respectively. This configuration is advantageous in integrated circuit technologies offering a thicker (or wider) metal layer at the top. The resistance per unit length R1' of conductors 11⁺ and 11⁻ determines how lossy the passive transmission line would be, hence how much power must be spent by the active network in order to compensate for those losses. For this reason, it is advantageous to allocate the largest possible cross-section to conductors 11⁺ and 11⁻. Conversely, there is no particular reason why conductors 12⁺ and 12⁻ should have a low resistance per unit length, therefore it is acceptable to keep them thin and narrow.

It is well known that the association of a transconductance Gm with a conductance G constitutes an elementary amplifier with a voltage gain A given by $$A = -\frac{Gm}{G} \quad (3)$$

and an output impedance Zout given by $$Zout = \frac{1}{G} \quad (4)$$

Figure 3B:
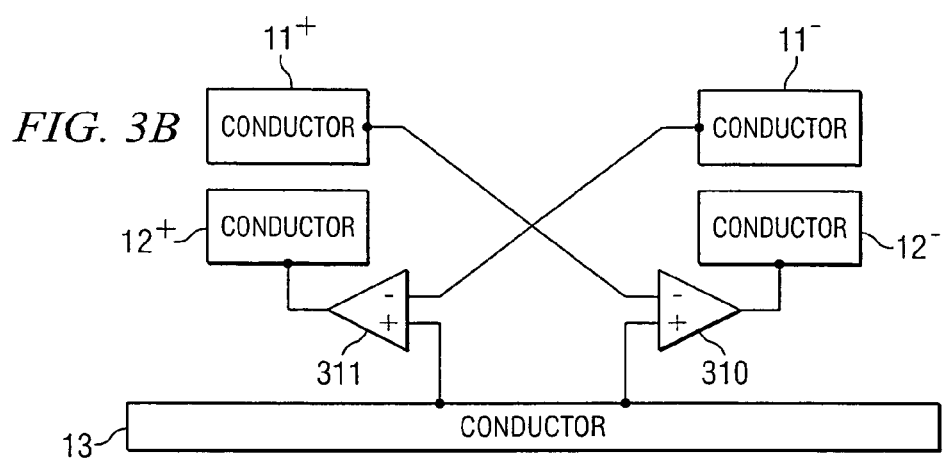

Therefore, the active shunt network shown in FIG. 3A can be replaced by other circuits having the function of an amplifier with the appropriate gain and output impedance as shown in FIG. 3B. The distributed nature of the ideal active shunt network can be approximated by placing a lumped amplifier such as 310, 311 at regular intervals Δx along the transmission line. The interval Δx must be much smaller than the shortest wavelength of interest for the application.

This is also true of the embodiment shown in FIG. 3A. To achieve conditions of lossless propagation, each amplifier must have a voltage gain $$A = -\frac{Gm2'}{G2'} = -\left(1 + \frac{C10'}{C12'}\right) \quad (5)$$

and an output impedance $$Zout = \frac{1}{\Delta x \cdot G2'} = \frac{M12'}{\Delta x \cdot R1' \cdot C12'} \quad (6)$$

Figure 3C:
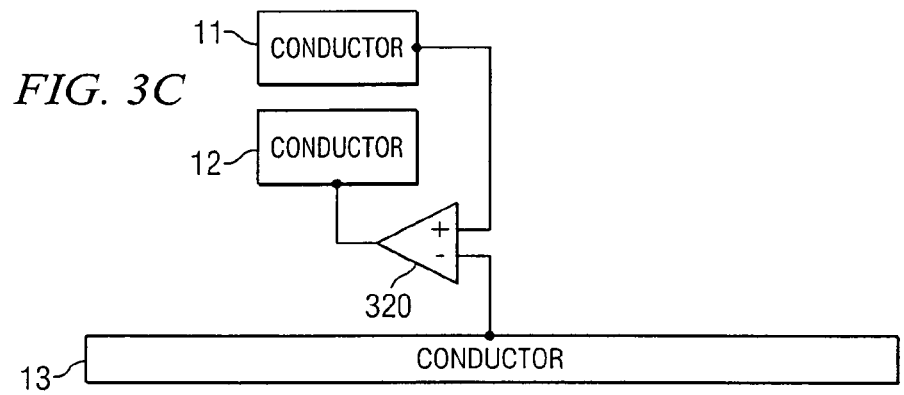
Figure 3D:
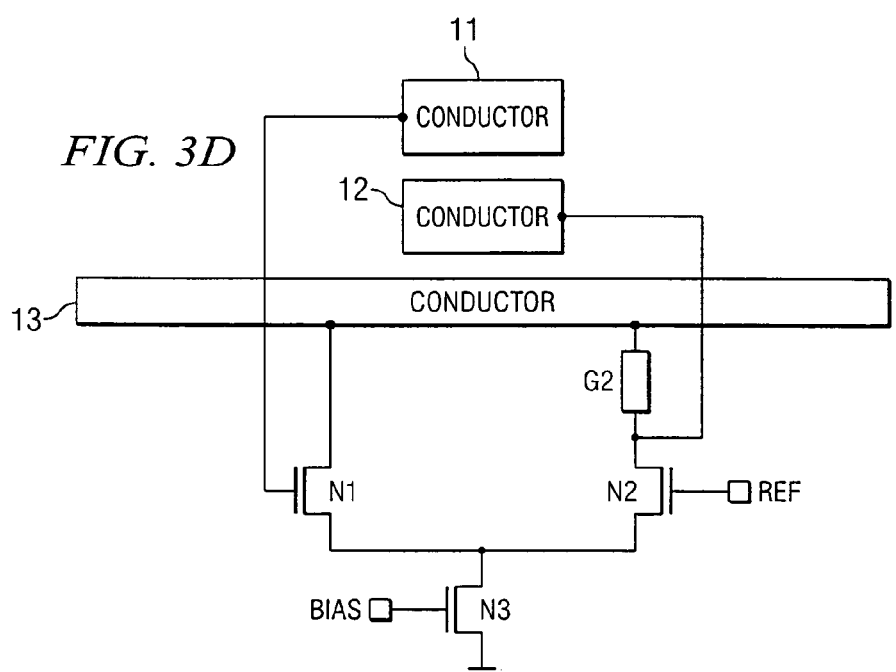

In this generalized framework, it can be seen that a single-ended (i.e. non-differential) version of the invention can be implemented as well. The schematic of a cross-section of a shunt network for the single-ended transmission line is shown in FIG. 3C. The main difference is that the amplifier constituting the active shunt network must have a positive gain in this case (non-inverting amplifier). Unfortunately, a positive gain can be obtained in practice only by cascading two amplification stages with negative gains, which makes the single-ended version somewhat less attractive than the differential version. A reasonable implementation of a single-ended shunt network as shown in FIG. 3D, which is a slightly modified version of the circuit shown in FIG. 3A, yielding a non-inverting amplification stage. The input terminal ref must be set to a constant voltage approximately equal to the DC component of the signal traveling in conductor 11. If one thinks in the framework of amplifiers instead of transconductances, then the benefit of the differential structure is that the amplifiers can be made inverting (single stage) instead of non-inverting by cross-connecting their inputs, whereby a single stage amplifier can be used for each side.

Figure 4:
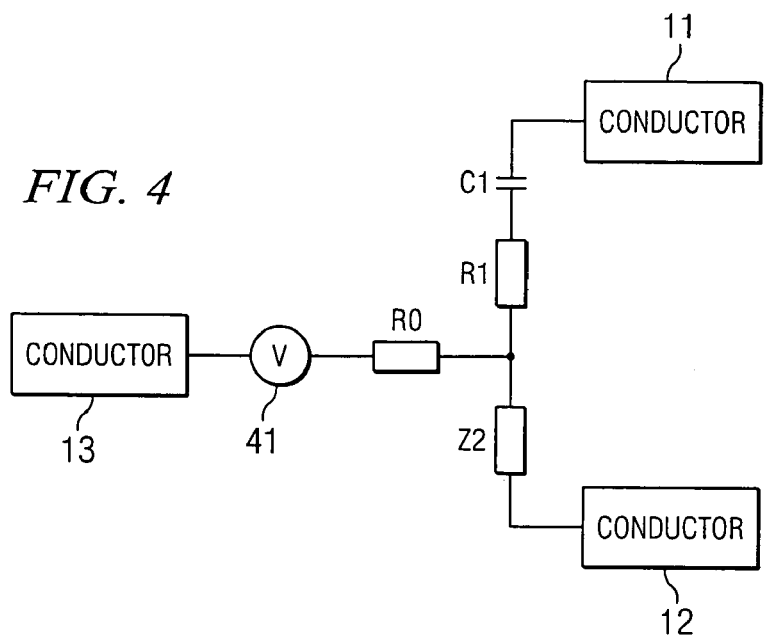
FIG. 4 shows a termination network.

To avoid reflections at the extremities, each pair of coupled transmission lines (11⁺, 12⁺ and 11⁻, 12⁻) is terminated by the lumped network shown in FIG. 4. At the driven end, a voltage source, such as source 41, can be inserted ahead of conductor 13 and resistance R0 can be partially or totally absorbed in the output impedance of the voltage source, if desired.

As will be discussed, reflections will be totally cancelled if the element values are the following:

$$R0 = v_{ph} M12' \quad (7)$$

$$R1 = v_{ph}(L1' - M12') \quad (8)$$

$$C1 = \frac{1}{v_{ph} R1'} \quad (9)$$

Transmission line parameters defined above in Table 1 apply again in this case. The phase velocity $v_{ph}$ is equal to the speed of light in the dielectric material surrounding the transmission line conductors. It depends only on the dielectric constant of this material.

The nature and value of impedance Z2 terminating conductor 12 does not affect propagation conditions in conductor 11. The range of possible choices includes the short circuit case (Z2=0), as well as the open-circuit case (conductor 12 left unconnected).

A 48 mm long transmission line (which could, for example, be used for a delay line, perhaps in a finite impulse response filter) has been simulated using a circuit simulator. This corresponds to a nominal delay of about 320 ps. The line was modeled by 4800 cascaded segments consisting of lumped capacitors, inductors and resistors. Numerical parameters for this line are listed in Table 2. They have been calculated using a finite-element approach for a 3.8 μm wide line using the top four metal layers of a 0.13 μm CMOS process.

TABLE 2

| Parameter | Value |
|---|---|
| C10' | 173 pF/m |
| C20' | 21.2 pF/m |
| C12' | 97.7 pF/m |
| L1' | 228 nH/m |
| L2' | 518 nH/m |
| M12' | 187 nH/m |
| R1' | 2.73 KΩ/m |
| R2' | 109 KΩ/m |
| G2' | 1.43 A/Vm |
| Gm2' | 3.95 A/Vm |

Figure 5:
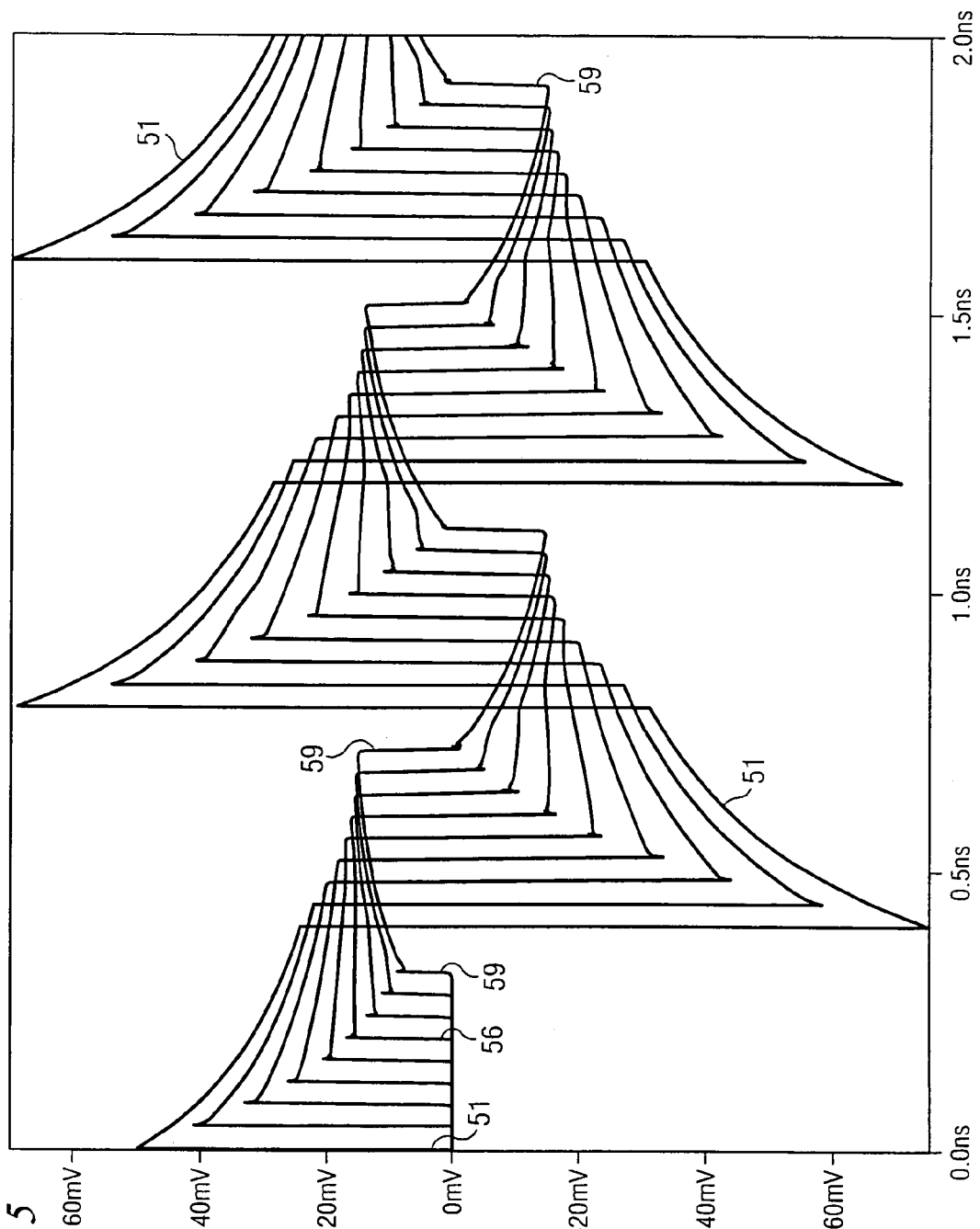
FIGS. 5, 6, and 7 show graphs of a test system.

In a first simulation, the active shunt networks (such as networks $21^+$ and $21^-$ in FIG. 2) were left out. A 1.25 GHz square wave with a peak-to-peak amplitude of 200 mV (differential) was applied to the input of the termination network. The voltage at nine different taps (51–59) at 6 mm intervals is shown in FIG. 5. As can be seen, edge amplitude decays rapidly with distance from the driving point.

Figure 6:
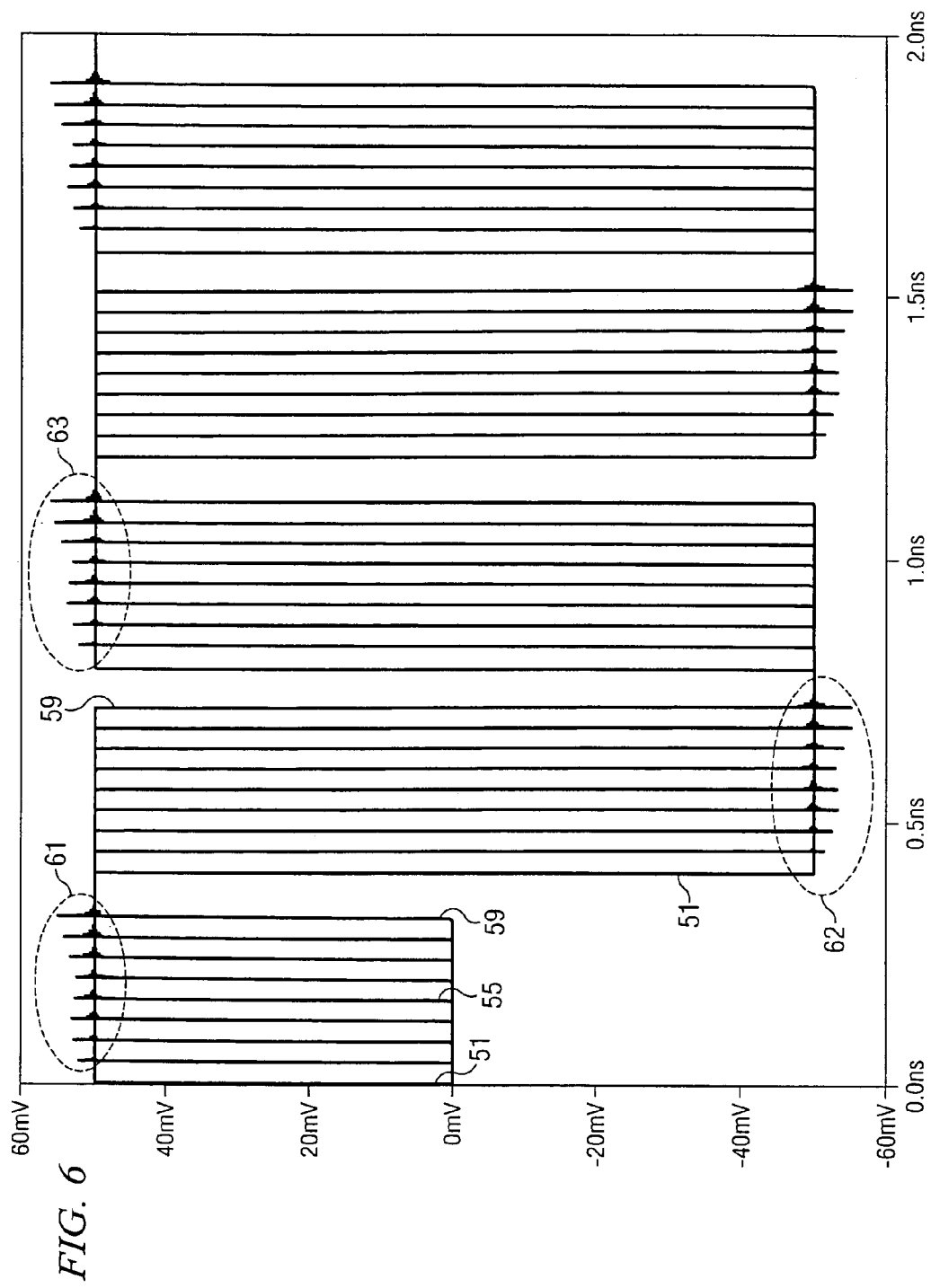

In a second simulation, shown in FIG. 6, the active shunt networks are added. Transconductances are modeled by voltage-controlled current sources. Therefore, the shunt network does not capacitively load the line, and the transconductance value is exact at any frequency. The waveforms at the same points (51–59) are shown in FIG. 6. The result is virtually ideal, free of attenuation and dispersion. This result confirms the expectation from theory that a lossless and dispersion-free transmission line can be achieved within the frequency range where the transconductances can operate properly. Some moderate ringing, which can be seen at edges 61, 62, 63, appears to be an artifact of modeling the transmission line by discrete inductances and capacitances. Such ringing also occurs in Spice simulations of conventional transmission lines when losses are very low and edges very sharp.

Figure 7:
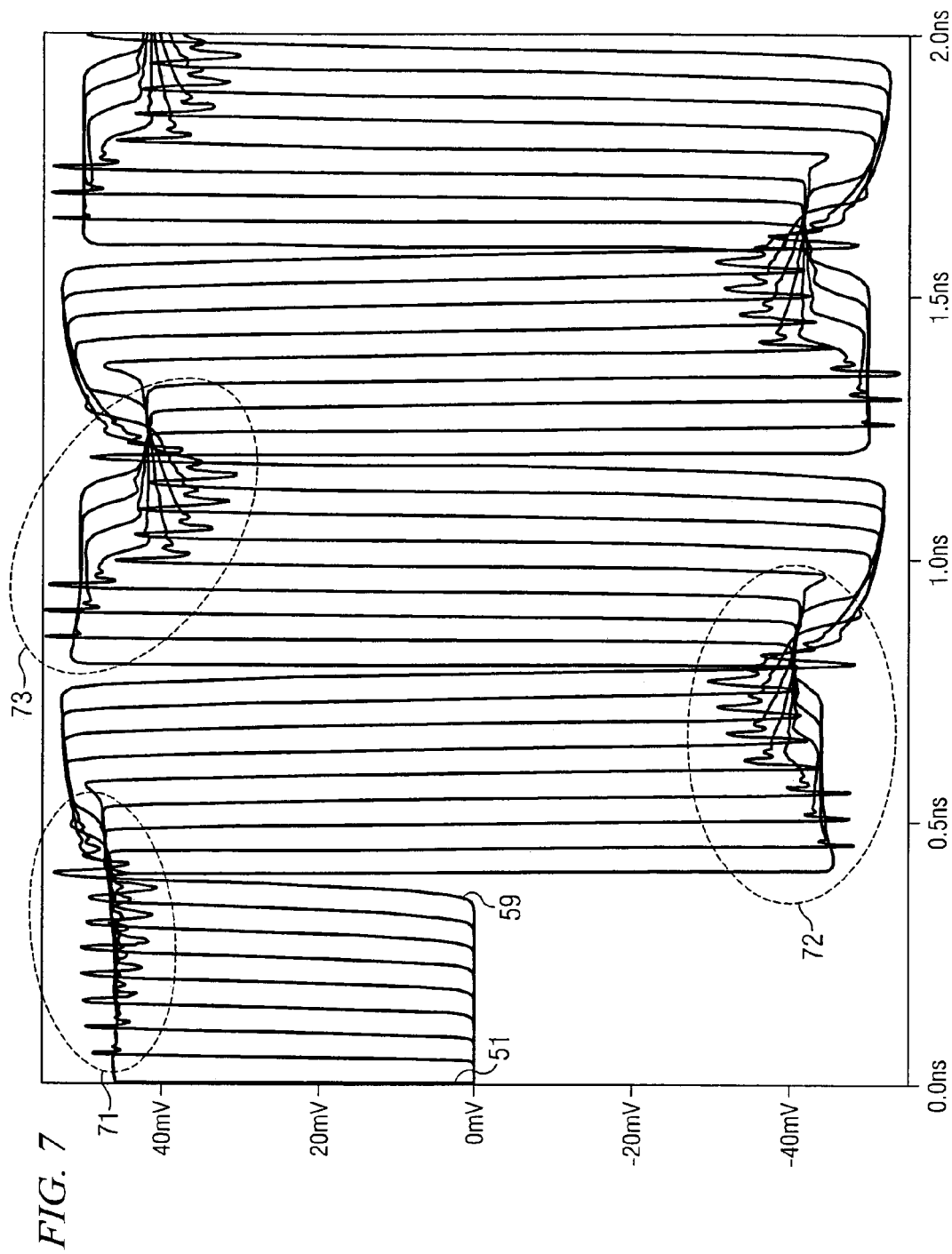

In a third simulation, shown in FIG. 7, transconductances are implemented by actual MOS transistors following the schematic shown in FIG. 3A. The oscillations in 71, 72 and 73 are again ringing, and are more visible here than in FIG. 6 because the ringing frequency is lower due to capacitive loading. Reflections can be seen in the bumps and dips occurring after the first 320 ps of the simulation. The waveforms look almost perfect for the first 320 ps because the transmission line was initially zero at all points. After traveling across the whole line (320 ps), the wave hits the termination and is partially reflected back because the termination does not perfectly match the transmission line characteristic impedance. The reflected wave adds to the forward wave which keeps coming from the source. Within ellipses 72 and 73, one can quite distinctly see that the perturbation is also a square wave which supports the view that the distortions are due to the addition of the reflected wave.

Some amount of dispersion can also be observed on traces corresponding to taps remote from the driving point. Comparing FIG. 7 to FIG. 6 and looking at the first 320 ps of simulation, it can be seen that the slope of the signal becomes gradually less steep as the wave propagates along the transmission line. In a perfectly non-dispersive situation, the waveform would remain identical during propagation. The likely reason for this imperfection is that the transconductance of MOSFETs decreases above some corner frequency due to channel transit time effects. Above this frequency, the conditions for lossless and dispersion-free propagation may not be able to be fully met.

Figure 8:
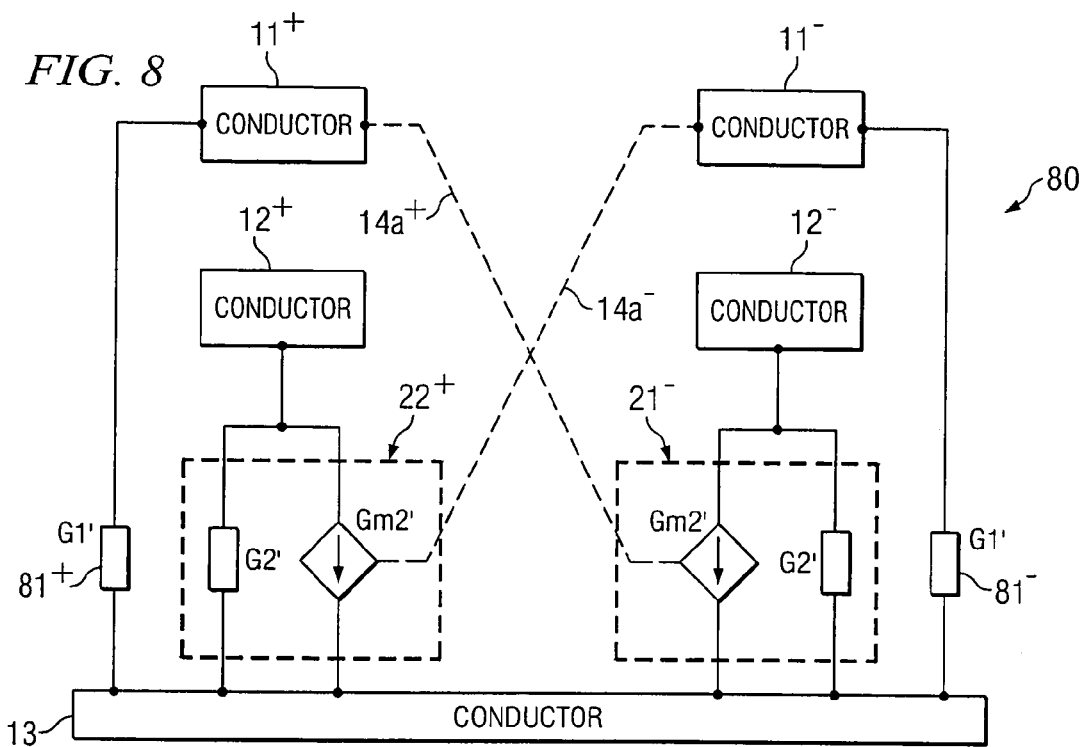
FIG. 8 shows one modification to achieve network gain.

Instead of only compensating for losses, it is possible to obtain gain from a slightly different version. FIG. 8 shows one possible modification to achieve network gain. This modification consists of adding distributed conductance $81^+$, $81^-$ between conductors $11^+$, $11^-$ and conductor 13, and modifying the value of transconductance Gm2'. In order to achieve a specific gain α (measured in Neper per unit length), element values should be chosen as follows:

$$G1' = \frac{\alpha^2}{R1'} \qquad (10)$$

$$G2' = \frac{R1' \cdot C12'}{M12'} \qquad (11)$$

$$Gm2' = R1' \frac{C10' + C12'}{M12'} + \frac{2\alpha}{v_{ph}M12'} - \frac{L1'}{M12'} \frac{\alpha^2}{R1'} \qquad (12)$$

Unlike conventional distributed amplifiers, there is no fundamental limit to the length over which this line will provide gain. However, reflections at the terminations would cause the amplifier to oscillate if the total gain multiplied by the reflection coefficient exceeded unity. Therefore, the maximum achievable gain is effectively limited by the accuracy with which reflections can be cancelled (or the reflections contained) at the terminations.

Figure 9:
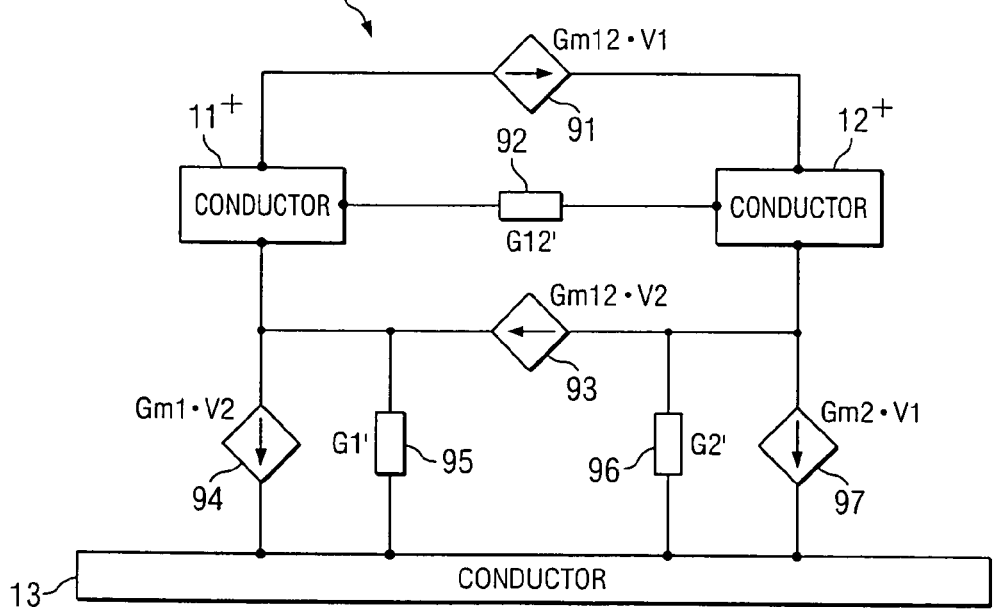
FIG. 9 shows a generalized shunt network.

FIG. 9 shows generalized shunt network 90 as a theoretical model for identifying other circuits which can control lossless transmission. This shunt network is made of conductances and transconductances between conductors $11^+$, $12^+$, and 13. In FIG. 9, V1 is the voltage between conductors $11^+$ and 13, and V2 is the voltage between conductor $12^+$ and 13. As will be discussed, wave propagation on conductor $11^+$ will be dispersion-free and present a gain per unit length α if the element values meet the following conditions:

$$Gm1' - G12' - Gm12' = 0 \qquad (13)$$

$$G2' + G12' + Gm12' = \frac{R1' \cdot C12'}{M12'} \qquad (14)$$

$$-Gm2' + G12' + Gm21' \geq \frac{L1'}{M12'} \frac{\alpha^2}{R1'} + R1' \cdot (C10' + C12') \qquad (15)$$

$$G1' + G12' + Gm21' = \qquad (16)$$
$$\frac{M12'}{L1'}(-Gm2' + G12' + Gm21' - R1' \cdot (C10' + C12'))$$

There are seven free parameters and only four constraints, therefore there are potentially many choices. The solution described with respect to FIG. 1 corresponds to the case where Gm1', G12', Gm12', Gm21' and G1' are all set to zero. This is believed to be the simplest circuit meeting these constraints, but other solutions exist.

Figure 10:
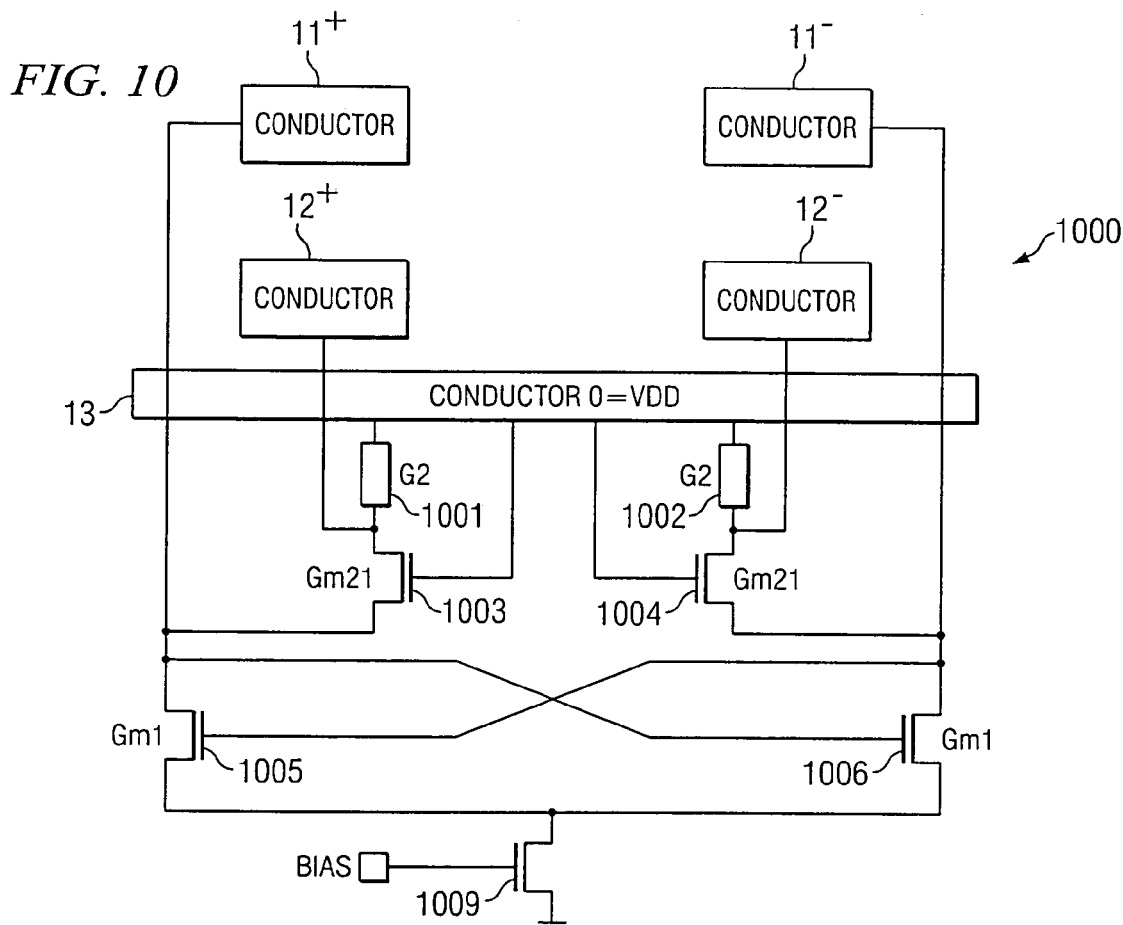
FIG. 10 shows a representative alternative circuit.

It is not possible to represent all possible circuits meeting these constraints in a single schematic because the connectivity of the network depends on the signs of element values. Negative element values can be implemented, for example, by cross-connecting the element between the two sides of a differential structure, as shown in FIGS. 1 and 2, whereas positive parameters correspond to elements connected solely to one side of the structure. It would be a tedious job to draw all possible solutions. Instead, just a single alternative solution is shown in FIG. 10 for the purpose of illustrating how diverse other solutions can become. This circuit corresponds to G12'=0, Gm12'=0 and Gm2'=0, which leads to a positive Gm21', a positive G2' and a negative G1'. This circuit has practical drawbacks compared to the preferred implementation, but in principle it would also work.

The distributed structure described in FIG. 1 can be approximated by a circuit made entirely of lumped elements. This lumped approximation is useful if the purpose of the circuit is to delay a signal by a specific amount, rather than transmitting the signal from one point to another. In this case, the coupled transmission lines are replaced by a ladder network of coupled lumped inductors and capacitors. A discrete active shunt network circuit is added at each node of the ladder network in order to cancel resistive losses in the inductors.

Figure 11:
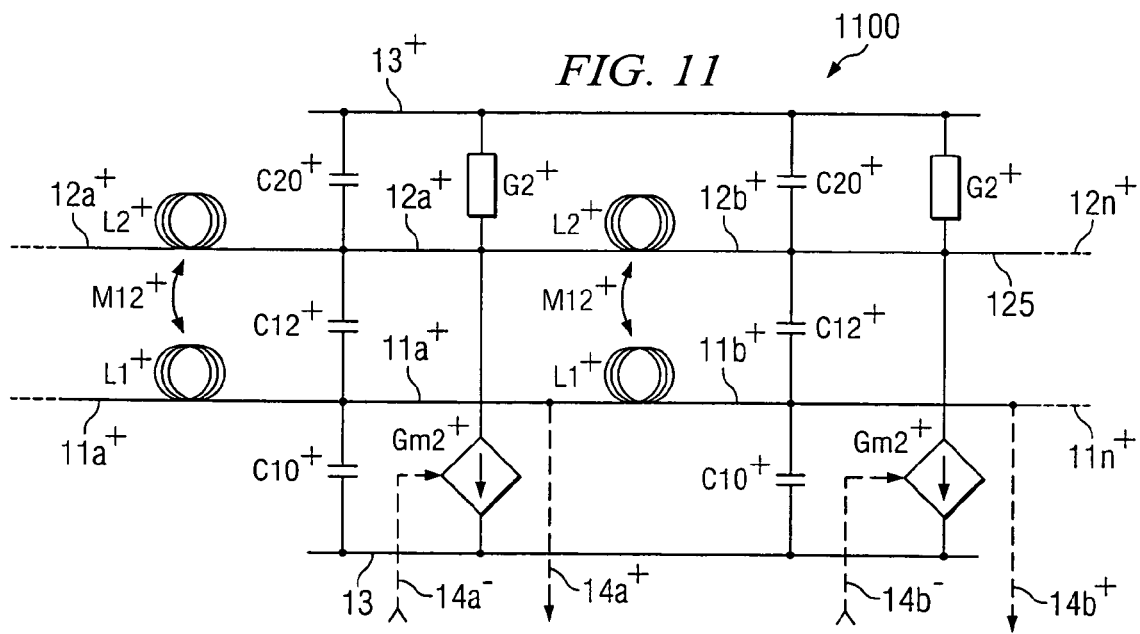
FIG. 11 is an approximation of a transmission line by a ladder network of inductors and capacitors.

A schematic of such an embodiment is shown in FIG. 11. The dashed arrows indicate that the controlled current sources Gm2$^+$ are controlled by the voltage on conductor 11$^-$ on the opposite side of the differential structure. Two stages of a single-ended network are shown, but the network may have any number of such stages in cascade. Only one side (the positive side) of the differential structure is shown. The second (negative) side is identical. Only intentional circuit elements are shown. The inductors unavoidably have some parasitic resistance in series which causes losses. The active shunt networks consisting of a conductance G2 and a controlled current source Gm2 cancel these losses. In practice, the active shunt networks can be implemented by the same circuit as shown in FIG. 3.

It can be shown that network 1100 constitutes a delay line. The signal applied to conductor 11 at one end of the line propagates at a constant velocity along the network. Each stage introduces a delay $\Delta t$ given by $$\Delta t = \sqrt{L1 \cdot \left( C10 + \frac{C12 \cdot C20}{C12 + C20} \right)} \tag{17}$$

Therefore, each stage approximates a length $v_{ph} \cdot \Delta t$ of distributed transmission line, where $v_{ph}$ is the velocity of light in the medium under consideration.

In order to achieve lossless and dispersion-free propagation, element values shown in FIG. 11 must be related as specified in the following equations:

$$G2 = \frac{R1 \cdot C12}{M12} \tag{18}$$

$$Gm2 = R1 \frac{C10 + C12}{M12} \tag{19}$$

$$M12 = \frac{C12}{C12 + C20} L1 \tag{20}$$

A number of possible applications of this concept exist. One such is in the transmission of high-speed signals across a large chip. Another is an amplifier. Two other applications will be described with respect to FIGS. 12A and 12B.

A finite impulse-response filter computes a discrete weighted sum of delayed copies of its input signal:

$$Y(t) = \sum_{k=1}^{N} W_k \cdot x(t - \Delta t_k) \tag{21}$$

The operation performed by the finite impulse response filter depends on the values of coefficients $W_k$, known as tap weights. The delays $\Delta t_k$ are typically integer multiples of some unit delay. Two possible analog implementations of a finite impulse response filter are illustrated in FIGS. 12A and 12B.

Figure 12A:
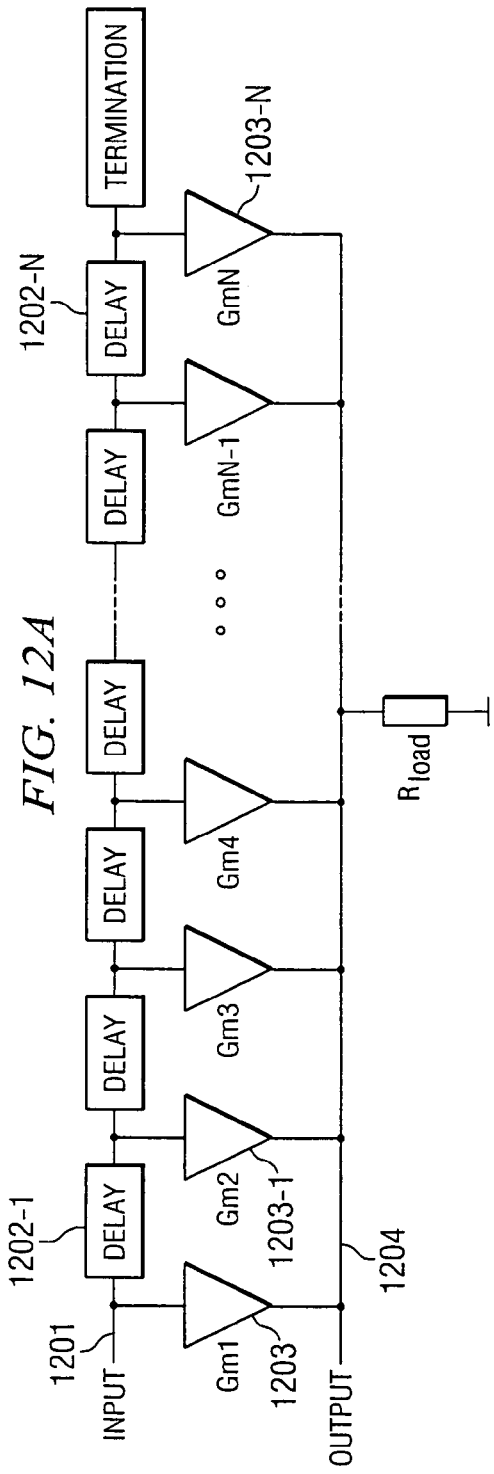
FIGS. 12A and 12B are illustrated circuit architectures implementing a finite impulse response filter.

FIG. 12A shows the input signal 1201 applied to delay line 1202. Taps along this line provide delayed copies of the input signal. The voltage at each tap is applied to a transconductance amplifier such as 1203-1 delivering a current proportional to the voltage. The ratio Gmk between current and voltage determines the tap weight. The currents from all transconductance amplifiers are added together on a global node output 1204 loaded by resistor $R_{load}$. The voltage on this global node is the output signal of the filter. This circuit works in principle, but it may be difficult in practice to reach very high speeds because the parasitic capacitance of the global output node tends to be large.

Figure 12B:
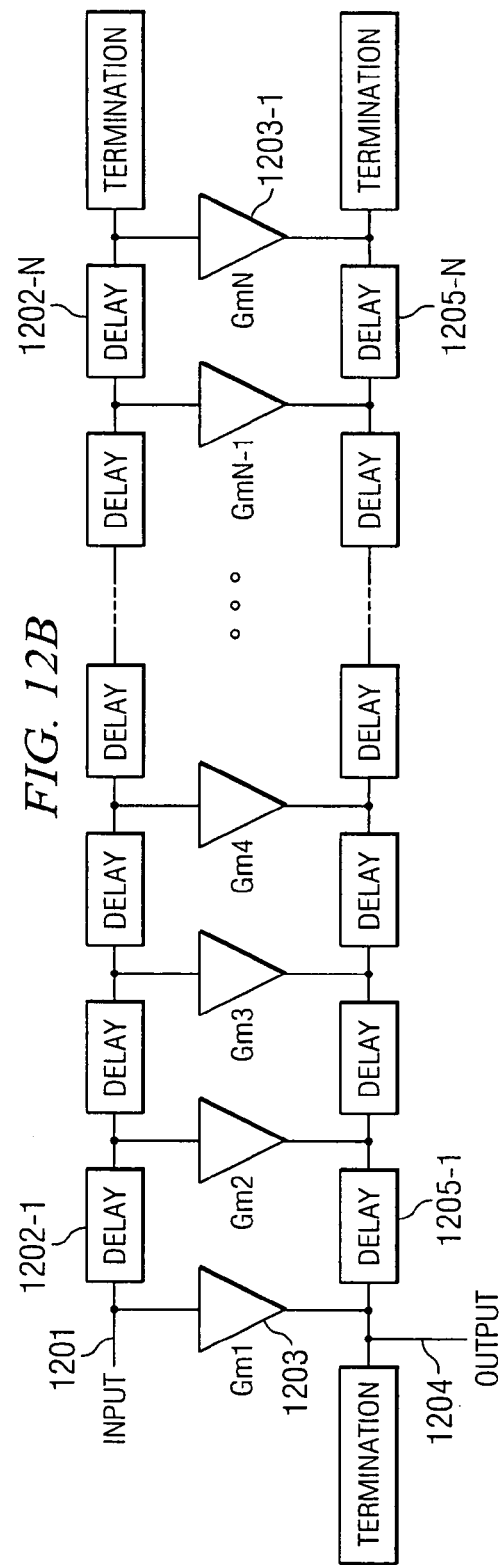

A slightly modified architecture is shown in FIG. 12B. In this variation, delay elements 1205 are added between the outputs of the transconductance amplifiers, whereby the delays on the input side are correspondingly reduced in order to maintain the same total delay as the signal travels from the input to the output through a given tap. This circuit operates in much the same way as does the circuit shown in FIG. 12A, but can achieve much higher bandwidth because the tap outputs are aggregated over a delay line. The reason is that the parasitic capacitance unavoidably present at the output of each transconductance amplifier becomes part of the delay line capacitance in this case. An implementation of this architecture using passive (i.e. lossy) inductor/capacitor ladders as delay lines has been published recently (see e.g., Wu, et al., "Differential 4-Tap and 7-Tap Transverse Filters in SiGe for 10 Gb/s Multimode Fiber Optic Link Equalization", *IEEE Int. Solid-State Circ. Conf.*, San Francisco, February 2003, hereinafter referred to as Wu). The Wu filters could be implemented using the techniques shown in FIGS. 12A and 12B.

Both architectures could be implemented either in the form of a distributed transmission line, or in the form of a lumped approximation.

As discussed above, the transmission line concepts can be used as an amplifier. If both ends of the transmission line are terminated as described with respect to FIG. 4, then a signal applied to one end will travel only one way across the line, and will be fully absorbed by the termination. If the termination does not perfectly match the characteristic impedance of the line, then at least a fraction of the signal will be reflected back and amplified again on the return to the source. Again, if the source impedance does not match the characteristic impedance of the line, a fraction of the signal is reflected back into the line.

If the total gain of the amplifying line is A, and if a fraction α of the signal is reflected back at each termination, then the line will become unstable if the product α·A exceeds unity. In this case, an oscillation will build up from noise and the line can be used as an oscillator. The fundamental oscillation frequency $f_0$ will be $$f_0 = \frac{v_{ph}}{2L} \tag{22}$$

where $v_{ph}$ is the speed of light in the considered medium and L is the length of the line. The oscillator output will generally also include harmonics of this frequency.

An economical way to produce such an oscillation would be to leave both ends of the line open (no termination), whereby α would approach unity. In this case, gain just slightly larger than unity should suffice to produce sustained oscillations.

In an integrated circuit, both $v_{ph}$ and L can be accurately controlled and stable over time and environmental conditions, therefore it should be possible to use such an oscillator as an on-chip frequency reference.

Figure 13:
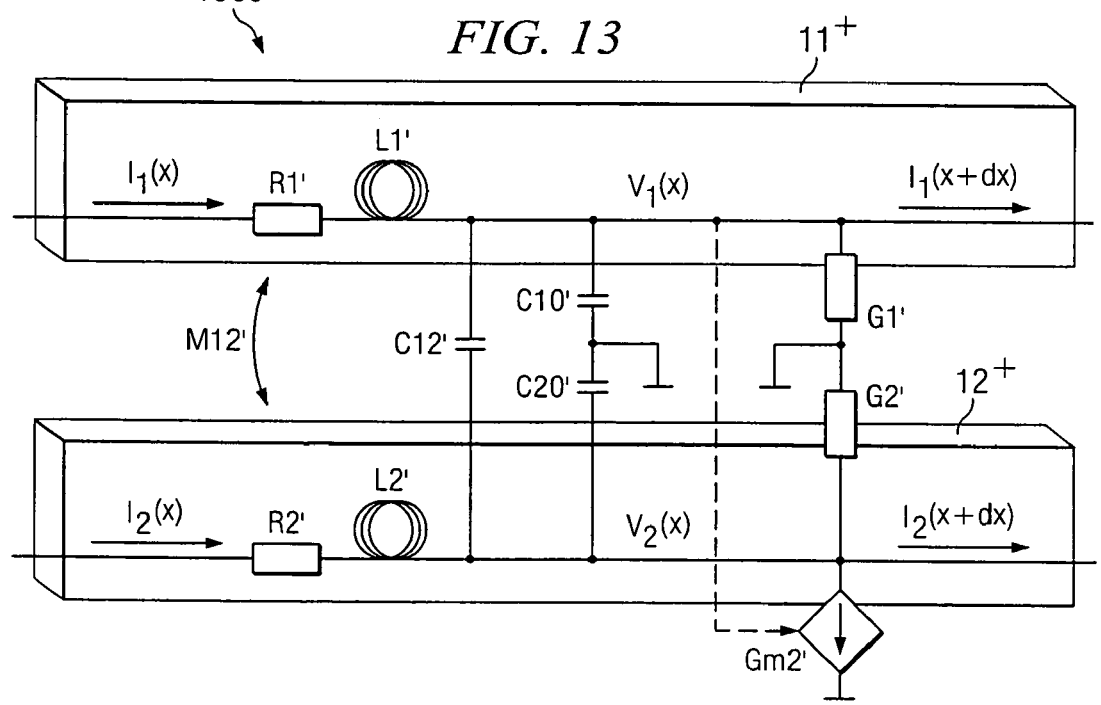
FIG. 13 is an equivalent circuit model of an active coupled line.

Wave propagation characteristics of a pair of coupled lines with a distributed active shunt network will now be derived. FIG. 13 (shown on the page with FIG. 4) shows equivalent circuit 1300 of a short segment of the structure under consideration. Distributed capacitances C10', C20' and C12', inductances L1', L2', M12' and series resistances R1' and R2' are inherent to the transmission line conductors. Shunt conductances G1', G2' and transconductance Gm2' are added in an attempt to make the line dispersion-free and lossless. The ground conductor 13 carrying the return currents is not explicitly shown.

It should be noted that the set of transmission line parameters is redundant if propagation is purely transverse electro-magnetic (TEM). Inductance parameters L1', L2' and M12' are related to capacitance parameters C10', C20' and C12'. It can be shown that the relationship between them is:

$$L1' = \frac{C12' + C20'}{C10'C20' + C10'C12' + C20'C12'} \cdot \frac{\varepsilon_r}{c_0^2} \tag{23}$$

$$L2' = \frac{C12' + C10'}{C10'C20' + C10'C12' + C20'C12'} \cdot \frac{\varepsilon_r}{c_0^2} \tag{24}$$

$$M12' = \frac{C12'}{C10'C20' + C10'C12' + C20'C12'} \cdot \frac{\varepsilon_r}{c_0^2} \tag{25}$$

In these equations, $c_0$ is the speed of light in vacuum and $\varepsilon_r$ is the dielectric constant of the medium surrounding the conductors.

The voltage gradient at a given point of the transmission line is related to the currents at this point as follows:

$$\begin{cases} \frac{\partial V_1}{\partial x} = -(R1' + sL1') \cdot I_1 - sM12' \cdot I_2 \\ \frac{\partial V_2}{\partial x} = -sM12' \cdot I_1 - (R2' + sL2') \cdot I_2 \end{cases} \tag{26}$$

Similarly, the current gradient can be written:

$$\begin{cases} \frac{\partial I_1}{\partial x} = -(G1' + s(C10' + C12')) \cdot V_1 + sC12' \cdot V_2 \\ \frac{\partial I_2}{\partial x} = -(-Gm2' + sC12') \cdot V_1 - (G2' + s(C20' + C12')) \cdot V_2 \end{cases} \tag{27}$$

It is helpful to rewrite these equations in matrix form:

$$\begin{cases} \frac{\partial}{\partial x}\begin{pmatrix} V_1 \\ V_2 \end{pmatrix} = -Z \cdot \begin{pmatrix} I_1 \\ I_2 \end{pmatrix} \\ \frac{\partial}{\partial x}\begin{pmatrix} I_1 \\ I_2 \end{pmatrix} = -Y \cdot \begin{pmatrix} V_1 \\ V_2 \end{pmatrix} \end{cases} \tag{28}$$

where $$Z = \begin{pmatrix} R1' + sL1' & sM12' \\ sM12' & R2' + sL2' \end{pmatrix} \tag{29}$$

$$Y = \begin{pmatrix} G1' + s \cdot (C10' + C12') & -sC12' \\ Gm2' - sC12' & G2' + s \cdot (C20' + C12') \end{pmatrix} \tag{30}$$

Currents can be eliminated from equation (28) in order to get a second-order differential equation of voltages:

$$\frac{\partial^2}{\partial x^2}\begin{pmatrix} V_1 \\ V_2 \end{pmatrix} = -\gamma^2 \begin{pmatrix} V_1 \\ V_2 \end{pmatrix} \tag{31}$$

where $$\gamma^2 = Z \cdot Y \tag{32}$$

In order to achieve dispersion-free wave propagation in conductor 11, the matrix $\gamma^2$ must have the following form:

$$\gamma^2 = \begin{pmatrix} \left(-\alpha + \frac{s}{v_{ph}}\right)^2 & 0 \\ \gamma_{21}^2 & \gamma_{22}^2 \end{pmatrix} \tag{33}$$

the gain exponent α must be real and positive or null. The quantity $v_{ph}$ is the phase velocity of the wave in conductor 11. Assuming that a matrix $\gamma^2$ of this form can be achieved, the solution of equation (31), as far as conductor 11 is concerned, can be written:

$$V_1(x) = A_f \exp(-\gamma_1 x) + A_r \exp(\gamma_1 x) \tag{34}$$

Parameters $A_f$ and $A_r$ are constants which must be determined using boundary condition at both ends of the transmission line. The propagation exponent is $$\gamma_1 = -\alpha + \frac{s}{v_{ph}} \tag{35}$$

The form of this propagation exponent implies that the magnitude of the wave traveling across conductor 11 grows exponentially with distance and has linear phase, hence no dispersion.

It remains to be shown that an appropriate choice of G1', G2' and Gm2' will indeed produce an exponent matrix $\gamma^2$ of the desired form. For this purpose, the first row of the matrix product ZY must be written out in detail using equations (29) and (30) and made equal to the first row of matrix $\gamma^2$ defined in equation (33). The resulting set of equations must be solved for G1', G2' and Gm2'. This simple but somewhat tedious procedure leads to the result that $\gamma^2$ has the required form if the following relations are satisfied:

$$G1' = \frac{\alpha^2}{R1'} \quad (36)$$

$$G2' = \frac{R1'C12'}{M12} \quad (37)$$

$$-Gm2' = R1'\frac{C10' + C12'}{M12'} - \frac{2\alpha}{v_{ph}M12'} + \frac{L1'}{M1'}\frac{\alpha^2}{R1'} \quad (38)$$

As one could have expected, the phase velocity $v_{ph}$ of the wave traveling across conductor 11 turns out to be:

$$v_{ph} = \frac{c_0}{\sqrt{\varepsilon_r}} \quad (39)$$

Equations (36)–(38) were already introduced above as equations without demonstration.

If the generalized active shunt network from FIG. 9 is considered instead of the simpler version of FIG. 13, matrix Y will be somewhat different, but the same procedure can be applied to find the result presented above.

The characteristic impedance of a pair of coupled lines cannot generally be expressed by a single scalar, but rather by a matrix $Z_c$. This matrix is the ratio between the series impedance matrix Z defined in equation (29) and the propagation exponent of the wave traveling in the line.

In the lossless case, $\alpha=0$, and the characteristic impedance matrix has the following form:

$$Z_c = \begin{pmatrix} \frac{v_{ph}R1'}{s} + v_{ph}L1' & v_{ph}M12' \\ Z_{c21} & Z_{c22} \end{pmatrix} \quad (40)$$

The terms $Z_{c21}$ and $Z_{c22}$ can be calculated but the resulting expressions are rather intricate and of little relevance to signal propagation on conductor 11. For this reason, the detailed expressions are not provided here.

A line of finite length must be terminated by a lumped network characterized by the same impedance matrix as $Z_c$. The termination network shown in FIG. 4 meets this constraint. If some finite gain or loss is present ($\alpha \neq 0$), the characteristic impedance matrix becomes more complicated and any termination network that would match the impedance of the coupled line perfectly is not a simple matter. Thus, $\alpha$ should be as small as possible to achieve decent results.

The disclosed transmission line is characterized by the propagation exponent shown in equation (35), which corresponds to the form required to achieve dispersion-free propagation. Equation (35) is written in the Laplace domain and therefore uses the Laplace variable s which is equal to jw. A negative sign for $\alpha$ is used in equation (35) because the circuit achieves gain. In the more conventional form (positive sign in front of $\alpha$), a positive value of $\alpha$ means that there are losses, whereas a negative value means that there is gain. Knowing that the invention has gain, it is best to use the opposite convention so that positive values of $\alpha$ mean gain.

Note that the concepts discussed herein become relevant at frequencies where the length of the transmission line reaches or exceeds about ¼ wavelength. With a signal of 1 GHz in a medium where electromagnetic waves propagate at about half the speed of light in vacuum, a wire starts to look like a transmission line if its length exceeds about 37.5 mm. Losses become important at this point. The value of 1 GHz is reasonable for use inside integrated circuits or on printed circuit boards. If long-distance, propagation is considered (on the order of meters or even kilometers), then transmission line theory applies at much lower frequencies, and losses would have to be considered as well.

Although the present invention and its advantages have been described in detail, it should be understood that various changes, substitutions and alterations can be made herein without departing from the invention as defined by the appended claims. Moreover, the present application is not intended to be limited to the particular embodiments of the process, machine, manufacture, composition of matter, means, methods and steps described in the specification. As one will readily appreciate from the disclosure, processes, machines, manufacture, compositions of matter, means, methods, or steps, presently existing or later to be developed that perform substantially the same function or achieve substantially the same result as the corresponding embodiments described herein may be utilized. Accordingly, the appended claims are intended to include within their scope such processes, machines, manufacture, compositions of matter, means, methods, or steps.

What is claimed is:

1. An amplifier comprising:
   a first primary conductor;
   a first auxiliary conductor inductively coupled to said first primary conductor; and
   non-inverting amplification with an input connected to said primary conductor and an output connected to said first auxiliary conductor, said non-inverting amplification being distributed along the length of said primary conductor and adjusted to provide overall gain along said primary conductor.

2. The amplifier of claim 1 further comprising:
   a ground conductor; and
   wherein said non-inverting amplification comprises:
   a first transistor having its gate connected to said first primary conductor, its drain connected to said ground conductor, and its source connected to the source of a second transistor; and
   said second transistor having its gate connected to a reference voltage input, its drain connected to said first auxiliary conductor and through a conductance to said ground conductor.

3. The amplifier of claim 2 further comprising:
   a current sink connected to said sources of said first and second transistor.

4. The amplifier of claim 1 wherein said non-inverting amplification comprises:
   non-inverting amplifiers at spaced intervals along said primary conductor.

5. The amplifier of claim 4 wherein said spaced intervals are equal.

6. An oscillator comprising:
   an amplifier in accordance with claim 1, and further comprising:
   a reflective termination for returning a substantial portion of a signal passing along said primary conductor.

7. The oscillator of claim 6 wherein the fraction of the signal reflected by said reflective termination when multiplied by said overall gain is greater than unity.

8. A differential amplifier comprising:
first and second primary conductors;
a first auxiliary conductor inductively coupled to said first primary conductor;
a second auxiliary conductor inductively coupled to said second primary conductor;
first inverting amplification with an input connected to said first primary conductor and an output connected to said second auxiliary conductor; and
second inverting amplification with an input connected to said second primary conductor and an output connected to said first auxiliary conductor, said first inverting amplification and second inverting amplification distributed along said primary conductors, said first inverting amplification and said second inverting amplification providing amplifier gain along said first and second primary conductors.

9. The amplifier of claim 8 further comprising:
a ground conductor common to said primary conductors and common to said auxiliary conductors; and
wherein each said first inverting amplification and said second inverting amplification has conductance with respect to said ground conductor.

10. The amplifier of claim 8 wherein said first inverting amplification and said second inverting amplification comprise inverting amplifiers spaced along said primary conductors.

11. The amplifier of claim 10 wherein each said inverting amplifier comprises:
a transistor and wherein the source of said transistor is connected together and also connected to a bias input.

12. The amplifier of claim 11 wherein said bias input comprises:
a current source.

13. An oscillator comprising an amplifier in accordance with claim 8 and further comprising:
reflective terminations reflecting a fraction of a signal applied to an input of said amplifier, said fraction such that the amplitude of the reflected signal multiplied by the amplifier gain exceeds the amplitude of said applied signal.

14. An oscillator comprising an amplifier in accordance with claim 8 and further comprising:
a reflective termination for returning a substantial portion of a signal passing along said primary conductors.

15. The oscillator of claim 14 wherein the fraction of the signal reflected by said reflective termination when multiplied by said overall gain is greater than unity.

16. A method for transporting a.c. signal to achieve oscillation, said method comprising:
propagating the a.c. signal along a primary conductor;
coupling said propagating signal from said primary conductor to an auxiliary conductor along the length of said primary conductor;
establishing both conductance and transconductance between said auxiliary conductor and a ground conductor;
establishing an overall gain along said primary and auxiliary conductors; and
reflecting said signal back at the termination of said primary and auxiliary conductors to achieve oscillation; and
wherein said reflected signal when multiplied by said overall gain is greater than unity.

17. The method of claim 16 wherein said transconductance is negative.

18. The method of claim 16 wherein said coupling comprises:
inductively coupling said a.c. signal.

19. The method of claim 18 wherein said inductively coupling comprises:
inductively coupling said propagating a.c. signal from said primary conductor to said auxiliary conductor along the length of said primary and auxiliary conductors.

* * * * *